(12) United States Patent
Sun et al.

(10) Patent No.: US 12,048,096 B2
(45) Date of Patent: Jul. 23, 2024

(54) PRINTED CIRCUIT BOARD, DISPLAY MODULE COMPRISING THE PRINTED CIRCUIT BOARD, DISPLAY DEVICE AND METHOD OF BONDING THE PRINTED CIRCUIT BOARD

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Hao Sun, Beijing (CN); Yong Yu, Beijing (CN); Chang Zhang, Beijing (CN); Ge Sun, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 482 days.

(21) Appl. No.: 17/405,257

(22) Filed: Aug. 18, 2021

(65) Prior Publication Data
US 2022/0141956 A1    May 5, 2022

(30) Foreign Application Priority Data
Nov. 2, 2020   (CN) .......................... 202011205836.7

(51) Int. Cl.
*H05K 1/11*       (2006.01)
*H05K 1/02*       (2006.01)
(Continued)

(52) U.S. Cl.
CPC ............. *H05K 1/118* (2013.01); *H05K 1/028* (2013.01); *H10K 59/12* (2023.02); *H10K 77/111* (2023.02)

(58) Field of Classification Search
CPC ....... H05K 1/118; H05K 1/028; H10K 77/111
See application file for complete search history.

(56) References Cited

U.S. PATENT DOCUMENTS

2014/0146491 A1*   5/2014   Chan ...................... H05K 3/323
                                                                    156/247
2017/0374740 A1*  12/2017  Yamaguchi ......... G02F 1/13306
(Continued)

FOREIGN PATENT DOCUMENTS

CN   104051675 A   9/2014
CN   109616507 A   4/2019
(Continued)

OTHER PUBLICATIONS

Office Action received for Chinese Patent Application No. 202011205836.7, mailed on Feb. 9, 2022, 18 pages (7 pages of English Translation and 11 pages of Office Action).

*Primary Examiner* — Hoa C Nguyen
(74) *Attorney, Agent, or Firm* — WOMBLE BOND DICKINSON (US) LLP

(57) ABSTRACT

Embodiments of the application provide a printed circuit board, a display module, a display device and a method of bonding the printed circuit board to a display screen. The printed circuit board includes a plurality of sub-circuit boards and a flexible connector between adjacent sub-circuit boards of the plurality of sub-circuit boards. The flexible connector is configured to connect the adjacent sub-circuit boards of the plurality of sub-circuit boards with each other. For the printed circuit board provided in the embodiments of the application, each sub-circuit board of the printed circuit board can be bonded independently, thereby avoiding pitch accumulation in the bonding region and thus controlling the total pitch within a satisfactory range.

6 Claims, 4 Drawing Sheets

(51) Int. Cl.
*H05K 1/14* (2006.01)
*H10K 59/12* (2023.01)
*H10K 77/10* (2023.01)

(56) References Cited

U.S. PATENT DOCUMENTS

2018/0204884 A1   7/2018  Isa
2021/0225239 A1   7/2021  Sun et al.
2022/0167496 A1*  5/2022  Byun .................. H05K 3/4691

FOREIGN PATENT DOCUMENTS

| CN | 110544434 A | 12/2019 |
| CN | 110767089 A | 2/2020 |
| CN | 111176037 A | 5/2020 |

\* cited by examiner

//* PRINTED CIRCUIT BOARD, DISPLAY MODULE COMPRISING THE PRINTED CIRCUIT BOARD, DISPLAY DEVICE AND METHOD OF BONDING THE PRINTED CIRCUIT BOARD

CROSS REFERENCE TO RELATED APPLICATIONS

The application claims the priority benefits of the patent application No. 202011205836.7 filed with the Patent Office of China on Nov. 2, 2020, the disclosure of which is incorporated herein by reference.

TECHNICAL FIELD

The application generally relates to the technical field of display device, and in particular to a printed circuit board, a display module comprising the printed circuit board, a display device and a method of bonding the printed circuit board to a display screen.

BACKGROUND

Liquid crystal display devices have been widely applied in industrial production and daily life, and new display technology such as AMOLED (active-matrix organic light-emitting diode) has also been developed by leaps and bounds. Moreover, flexible display and full-screen display represent the development trend in the near future and the next few years.

However, at present, there are still links and factors affecting the product yield in the production process of various display devices, and there is still much room for improvement in the product quality of the display devices.

SUMMARY

An embodiment of the application provides a printed circuit board, the printed circuit board comprising a plurality of sub-circuit boards and a flexible connector between adjacent sub-circuit boards of the plurality of sub-circuit boards, the flexible connector is configured to connect the adjacent sub-circuit boards of the plurality of sub-circuit boards with each other.

In some embodiments, each of the plurality of sub-circuit boards comprises a rigid board region and a flexible bonding region, the flexible bonding region is adjacent to the rigid board region and a thickness of the flexible bonding region is smaller than a thickness of the rigid board region.

In some embodiments, the flexible bonding region comprises a flexible bendable material, a first wire and first metal pin, and wherein the first wire is drawn from the rigid board region and extends to the first metal pin within the flexible bendable material, the first metal pin is exposed to an outside of the flexible bendable material.

In some embodiments, the flexible connector comprises a second wire for electrically connecting the adjacent sub-circuit boards of the plurality of sub-circuit boards with each other.

Another embodiment of the disclosure provides a display module, comprising a display screen and the printed circuit board according to any of the foregoing embodiments, and the printed circuit board is bonded to the display screen.

In some embodiments, each of the plurality of sub-circuit boards comprises a rigid board region and a flexible bonding region, the flexible bonding region is adjacent to the rigid board region and connected therewith as a whole.

In some embodiments, the display screen comprises a flexible display screen, and the flexible display screen comprises a display screen bonding region corresponding to the flexible bonding region of the printed circuit board, and the display screen bonding region comprises a plurality of second metal pins, the flexible bonding region of the printed circuit board comprises a plurality of first metal pins, the plurality of second metal pins are in one-to-one correspondence with and contact the plurality of first metal pins of the flexible bonding region, respectively.

In some embodiments, at least part of the plurality of sub-circuit boards comprise a first integrated circuit chip in the rigid board region of the sub-circuit boards, and the flexible display screen comprises a second integrated circuit chip, and the first integrated circuit chip is electrically connected to the second integrated circuit chip via the first metal pins and the second metal pins.

In some embodiments, the second integrated circuit chip comprises at least one selected from a group consisting of a data driving circuit and a gate driving circuit, and the first integrated circuit chip comprises at least one selected from a group consisting of a power supply circuit and a timing control circuit.

Yet another embodiment of the application provides a display device comprising the display module as mentioned in the above embodiments.

Still another embodiment of the application provides a method of bonding the printed circuit board as mentioned in the above embodiments to a display screen, the display screen comprising a display screen bonding region corresponding to the flexible bonding region of the printed circuit board, the display screen bonding region comprising a plurality of second metal pins, the method comprises: applying an anisotropic conductive adhesive on at least one of the flexible bonding region and the display screen bonding region; aligning the first metal pin of the flexible bonding region with a second metal pin of the plurality of the second metal pins to be bonded to the first metal pin; and heating the anisotropic conductive adhesive on the flexible bonding region or the display screen bonding region to electrically connect the first metal pin and the second metal pin.

BRIEF DESCRIPTION OF DRAWINGS

By referring to the detailed description of the non-restrictive embodiments made with reference to the drawings below, other features, objectives and advantages of the application will become more apparent.

DETAILED DESCRIPTION OF EMBODIMENTS

Figure 1:
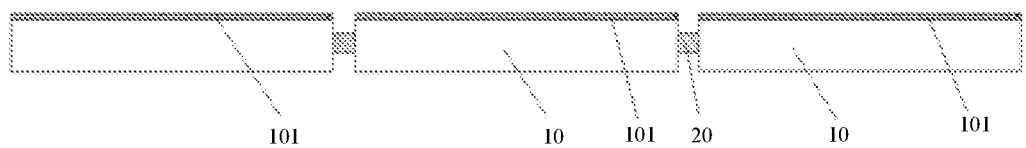
FIG. 1 shows a schematic structure view of a printed circuit board according to an embodiment of the application.

The application will be further explained in detail in combination with the drawings and the embodiments. It can be understood that the specific embodiments described herein are only used for explaining principles of the technical solution of the application, instead of limiting the scope of the application. Besides, it should be further noted that in order to facilitate the description, only structures related to the technical solution set forth in the application are shown in the drawings.

Where no conflict is caused, the embodiments of the application and the features of the embodiments can be combined with each other to obtain other different embodiments, and these embodiments still belong to disclosure of the patent application.

An embodiment of the application provides a printed circuit board, which comprises a plurality of sub-circuit boards and a flexible connector between adjacent sub-circuit boards of the plurality of sub-circuit boards, and the flexible connector is configured to connect the adjacent sub-circuit boards of the plurality of sub-circuit boards with each other. FIG. 1 shows an example of the printed circuit board, which comprises three sub-circuit boards 10 and two flexible connectors 20, each flexible connector connecting two adjacent sub-circuit boards with each other. FIG. 1 further shows a bonding region 101 of each sub-circuit board, the bonding region 101 may comprise metal pins (or referred to as "gold fingers") exposed on a surface of the sub-circuit board, and the metal pins may be used as input points for external signals or output points for internal signals from the sub-circuit boards, and thereby signal transmission between the sub-circuit board and external devices can be realized via these metal pins.

The printed circuit board provided in the embodiment of the application can be applied to a display product in order to improve the quality of connection between the printed circuit board and the display screen of the display product.

Figure 2:
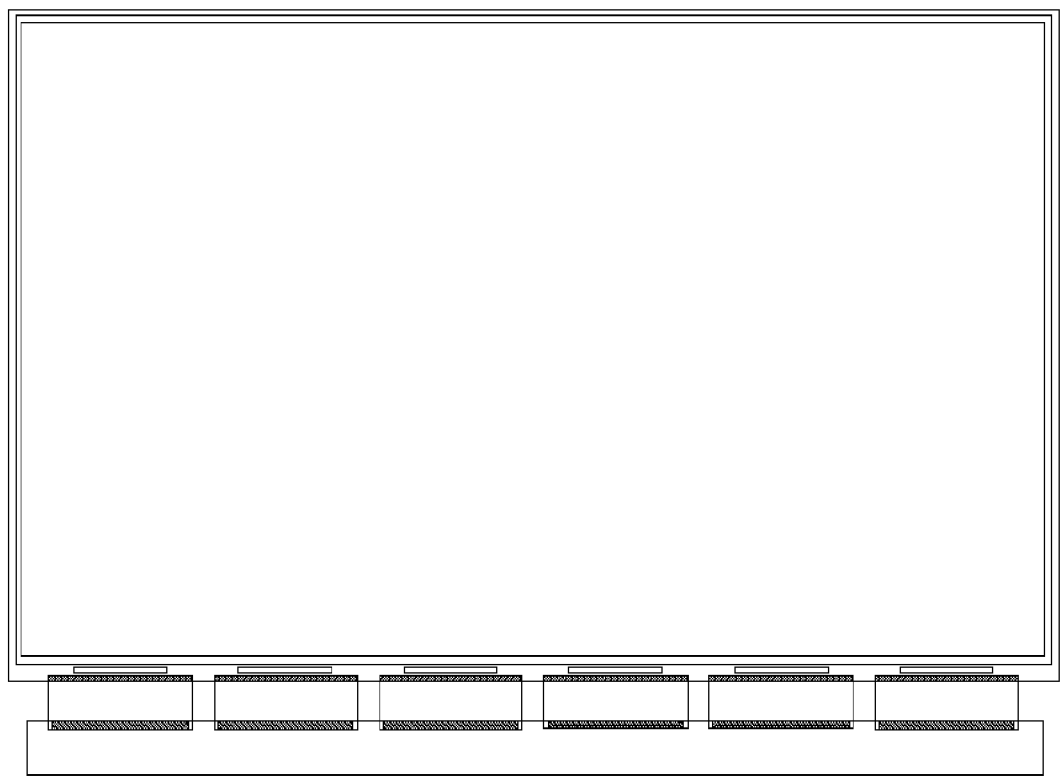
FIG. 2 illustrates an example of a typical printed circuit board connected to an OLED display screen via FPCs.
Figure 3:
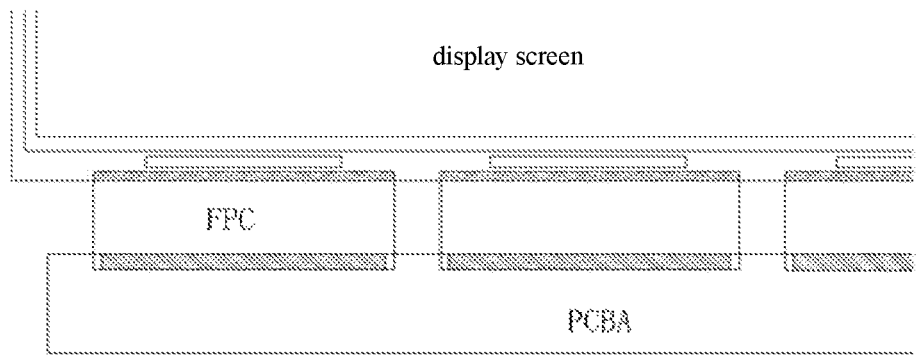
FIG. 3 shows a local enlarged view reflecting two FPCs of FIG. 2.

Currently, in pursuit of a narrow frame effect for a display device, a COP (COF on Panel) & FOP (FPC on Panel) encapsulation technique is required, but this will bring a series of process problems. For example, for an AMOLED flexible display device, a crucial technical bottleneck of the COP & FOP encapsulation technique lies in the process procedure of bonding a printed circuit board to a flexible display screen. The term "printed circuit board" herein may refer to either a circuit board on which no components are installed, i.e., a printed circuit bare board, or a circuit board on which electrical components have been installed, i.e., a combination of a printed circuit bare board and electrical components, e.g., an integrated circuit chip bonded to the printed circuit bare board by means of a SMT (Surface Mount Technology) or DIP (Dual Inline-Pin Package) process. The process of COP (COF on Panel) & FOP (FPC on Panel) comprises the technique of bonding a printed circuit board to a display screen. An example of the "bonding" process comprises thermally combining the printed circuit board with the FPCs of the display panel by means of ACF (Anisotropic Conductive Film), and in this case the bonding process mainly comprises steps of ACF application and hot press. However, the difference in the degree of expansion of an FPC connected to an OLED panel and a rigid printed circuit board during the bonding procedure is very large, moreover, the printed circuit board for use in an OLED display product has a long length since many electrical components are to be arranged thereon. FIG. 2 schematically shows an example of a typical printed circuit board connected to an OLED display screen via FPCs, and FIG. 3 shows a local enlarged view reflecting two FPCs of FIG. 2. In the example of FIG. 2, the printed circuit board is bonded to a flexible display screen via six FPCs. For an intact printed circuit board, no matter from which section of the printed circuit board the aforementioned bonding process starts, a relative expansion between the printed circuit board and the FPCs will occur in the bonding region, and this relative expansion will accumulate from the area where the bonding process starts first to the area where the bonding process starts later. For example, for the example of FIG. 2, if the bonding process for the printed circuit board starts from left to right, the relative expansion between the FPCs and the printed circuit board will accumulate sequentially from left to right, which will eventually result in a pin mismatch between the printed circuit board and the FPCs, i.e., the metal pins of the printed circuit board and the pins of the FPCs cannot be matched correctly. Therefore, it is necessary to control a total pitch between the metal pins of the printed circuit board and the metal pins of the FPCs. The term pitch means a degree of misalignment between a metal pin and another pin that are to be bonded together. A way of reducing the total pitch includes shortening the length of each FPC and bonding the FPCs one by one so as to control the pitch in the bonding region of a single FPC strictly, but this requires more machine devices for performing the bonding process, which increases the product costs. To decrease the number of bonding processes, it is required that the FPC should have a long length, e.g., an individual FPC comprise three or more bonding regions, but this requirement can hardly be satisfied according to the current FPC manufacturing process. Currently, for a FPC with a length of 70 mm, the total pitch can be controlled within 30 um, and if the length of the FPC exceeds 70 mm, the total pitch may reach 60 um, and if the length of the FPC reaches 140 mm, the total pitch may go up to 90 um, and if the length of the FPC exceeds 210 mm, the total pitch will exceed 120 um. In particular, for a flexible notebook product or an in-vehicle display product, the size is relatively large and the length thereof usually exceeds 250 mm. In this case, the total pitch between the FPC and the printed circuit board will exceed 120 um, which will obviously lead to a pin mismatch between the printed circuit board and the FPC.

The printed circuit board put forth in the embodiments of the application comprises a flexible connector, by which the sub-circuit boards of the printed circuit board are connected with each other, therefore in this case, individual FPCs can be designed to have a relatively long length to decrease the total number of bonding processes, and the bonding process can be performed for each sub-circuit board independently, thereby avoiding total pitch accumulation during the bonding procedure and thus effectively controlling the total pitch for display products having a large size.

Figure 4:
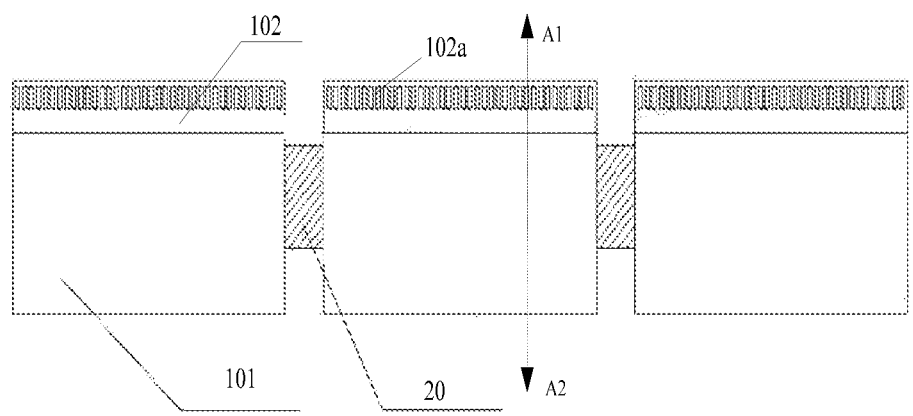
FIG. 4 is a schematic structure view of a printed circuit board according to another embodiment of the application.
Figure 5:
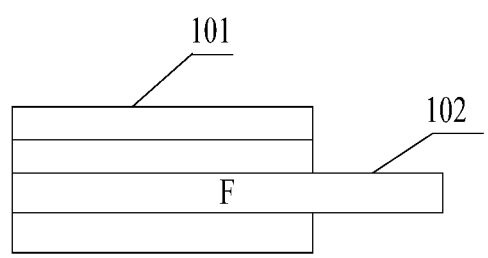
FIG. 5 shows a sectional view of the sub-circuit board of FIG. 4 taken along A1-A2.

As shown in FIG. 4, according to a further embodiment of the application, each of the plurality of sub-circuit boards of the printed circuit board comprises a rigid board region 101 and a flexible bonding region 102, and the flexible bonding region 102 is adjacent to the rigid board region 101, and a thickness of the flexible bonding region 102 is smaller than a thickness of the rigid board region. FIG. 5 shows a sectional view of the sub-circuit board of FIG. 4 taken along A1-A2. According to an embodiment of the application, each sub-circuit board includes multilayer structures, and one or more layers of the multilayer structures comprise a flexible material layer F, which extends outwards and protrudes from the rigid board region 101 as compared with other layer structures, thereby forming the flexible bonding region 102.

Furthermore, according to an embodiment of the application, the flexible bonding region comprises a flexible bendable material, a first wire and a first metal pin, and the first wire is drawn from the rigid board region and extends to the first metal pin within the flexible bendable material, and the first metal pin is exposed to an outside of the flexible bendable material. FIG. 4 schematically shows a first metal pin 102a. Therefore, the printed circuit board provided in the embodiments of the application can be directly bonded to a display screen via the flexible bonding region 102 without any FPCs between the display screen and the printed circuit board. With the printed circuit board provided in the embodiments of the application, the procedure of bonding the FPCs to the display screen can be omitted, which simplifies the manufacturing process and saves the costs involved in the fabrication of the FPCs.

In some embodiments, the flexible connector comprises a second wire for electrically connecting the adjacent sub-circuit boards of the plurality of sub-circuit boards with each other. The flexible connector can comprise any suitable flexible insulating material, in which the second wire is wrapped, such that signal transmission between the sub-circuit boards is realized and that the sub-circuit boards can be displaced relative to each other, thereby facilitating a separate bonding process for each sub-circuit board and avoiding pitch accumulation.

Figure 6:
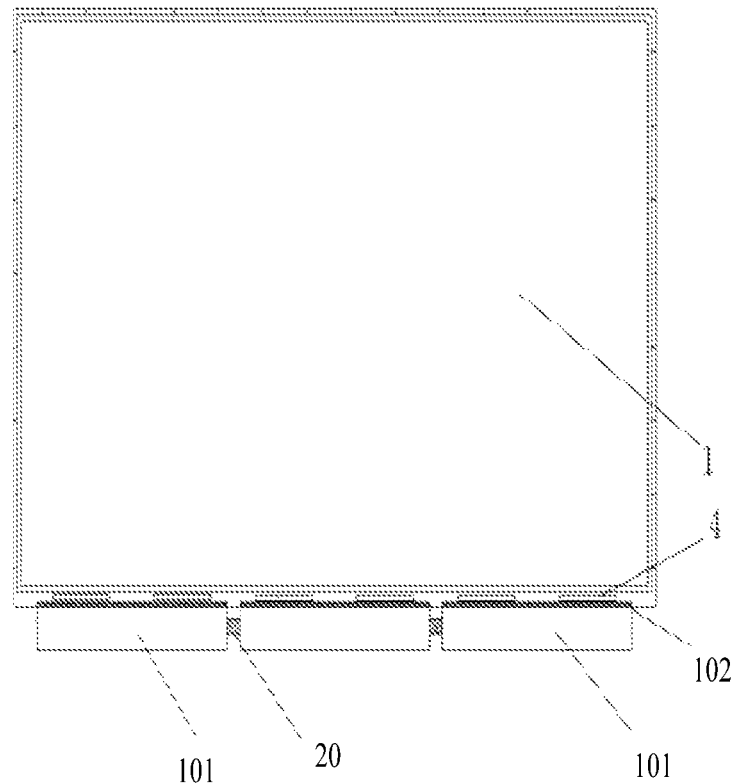
FIG. 6 schematically shows an example of a display module provided according to an embodiment of the application.

Another embodiment of the application provides a display module, which comprises a display screen and the printed circuit board as mentioned in any of the above embodiments, and the printed circuit board is bonded to the display screen. FIG. 6 schematically shows an example of the display module, which comprises a display screen 1, and each sub-circuit board of the printed circuit board is bonded to the display screen 1 via the flexible bonding region 102. The display screen 1 may comprise several integrated circuit chips 4, and the flexible bonding regions 102 of the printed circuit board can be electrically connected with the integrated circuit chips 4. As in the above embodiments, each sub-circuit board comprises a rigid board region 101 and a flexible bonding region 102, and the flexible bonding region 102 is adjacent to the rigid board region 101 and connected therewith as a whole.

Figure 7:
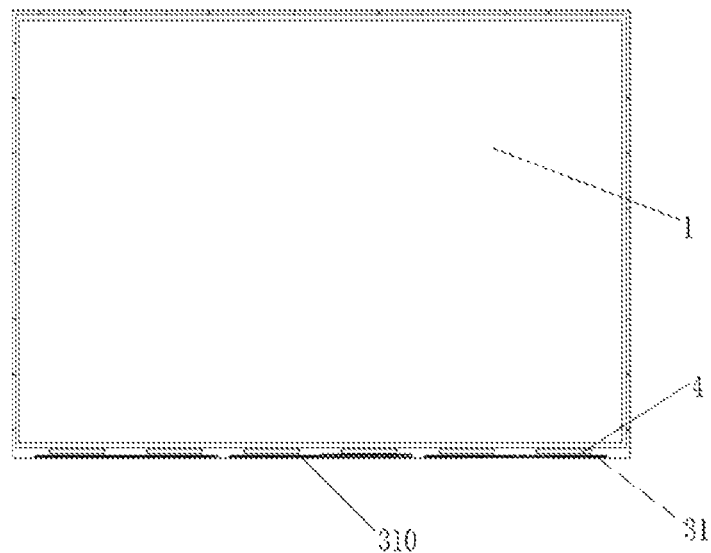
FIG. 7 schematically shows an example of a flexible display screen according to an embodiment of the application.

In some embodiments, the display screen 1 comprises a flexible display screen, and the flexible display screen comprises a display screen bonding region corresponding to the flexible bonding region 102 of the printed circuit board, and the display screen bonding region comprises a plurality of second metal pins, and the plurality of second metal pins are in one-to-one correspondence with and contact the first metal pins of the flexible bonding region 102, respectively. FIG. 7 shows an example of the flexible display screen. As shown in FIG. 7, a display screen bonding region 31 is provided in a bottom edge region of the display screen, and the display screen bonding region comprises second metal pins 310. When the printed circuit board is bonded to the display screen 1, the plurality of second metal pins 310 of the display screen bonding region are in one-to-one correspondence with and contact the first metal pins of the flexible bonding region of the printed circuit board, respectively. In some embodiments, the second metal pins 310 are electrically connected with the integrated circuit chip 4, thereby realizing signal transmission between the integrated circuit chip 4 and the printed circuit board.

In some embodiments, at least part of the sub-circuit boards comprise a first integrated circuit chip in the rigid board region of the sub-circuit board, and the flexible display screen comprises a second integrated circuit chip (e.g., the integrated circuit chip 4), the first integrated circuit chip is electrically connected to the second integrated circuit chip via the first metal pins and the second metal pins. The specific details of the first integrated circuit chip and the second integrated circuit chip are not particularly limited herein, the first integrated circuit chip may be a chip required for a peripheral control circuit of the display module, and the second integrated circuit chip can be a chip arranged inside the display region of the display module. For example, the second integrated circuit chip may comprise at least one selected from a group consisting of a data driving circuit and a gate driving circuit, the data driving circuit provides data signals to each pixel of the display module and the gate driving circuit provides gate scan signals to each pixel of the display module. The first integrated circuit chip may comprise at least one selected from a group consisting of a power supply circuit that can provide a suitable supply voltage for each electronic component of the display module and a timing control circuit that can provide necessary timing signals for the data driving circuit to output the data signals and the gate driving circuit to output the gate scan signals.

Figure 8:
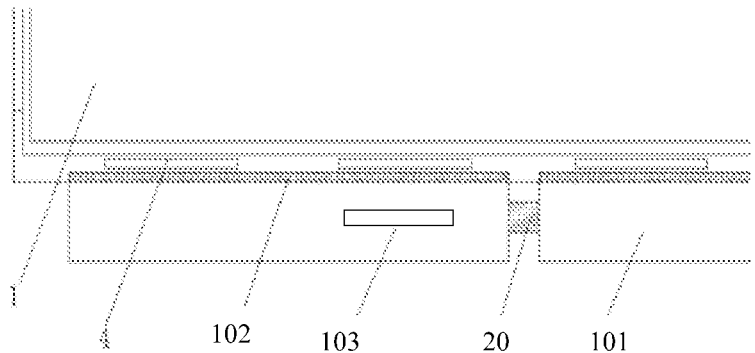
FIG. 8 schematically shows a local enlarged view of FIG. 6.

FIG. 8 schematically shows a local enlarged view of FIG. 6, which reflects part of the sub-circuit boards of the printed circuit board. The first metal pins in the flexible bonding region 102 of a sub-circuit board are in contact with the second metal pins in the display screen bonding region of the flexible display screen 1, and the first integrated circuit chip 103 on the rigid board region of the sub-circuit board is electrically connected to the second integrated circuit chip 4 via the first metal pins in the flexible bonding region 102 and the second metal pins in the flexible display screen 1 such that signal transmission is enabled between the first integrated circuit chip 103 and the second integrated circuit chip 4.

Figure 9:
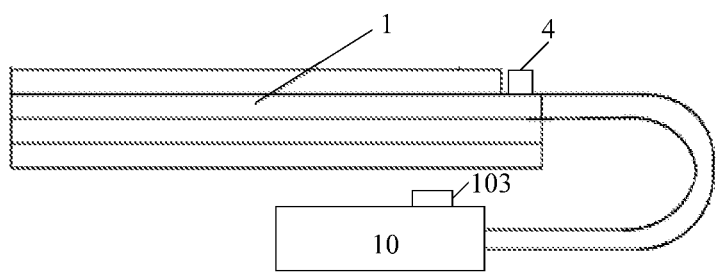
FIG. 9 schematically shows that a flexible bonding region of a sub-circuit board of the printed circuit board is bent so that the sub-circuit board is hidden behind a display screen.

According to some embodiments of the application, the display module is a flexible display module, and if the printed circuit board is bonded to the flexible display screen, the flexible bonding region 102 of the printed circuit board is bendable, so the printed circuit board can be hidden behind the display screen. FIG. 9 schematically shows that the flexible bonding region 102 of the sub-circuit board 10 of the printed circuit board is bent so that the sub-circuit board 10 is hidden behind the display screen 1, which facilitates the frame narrowing of the display products.

Yet another embodiment of the application provides a display device, which comprises the display module as mentioned in any of the above embodiments. The display device can be any electronic product having a display function, comprising but being not limited to a notebook computer, a navigator, a tablet computer, a cellphone and so on.

Still another embodiment of the application provides a method of bonding a printed circuit board to a display screen, and the printed circuit board may be the printed circuit board as mentioned in the above embodiments. The flexible bonding region of the printed circuit board comprises a plurality of first metal pins, and the display screen comprises a display screen bonding region corresponding to the flexible bonding region of the printed circuit board, and the display screen bonding region comprises a plurality of second metal pins, and the method comprises: applying an anisotropic conductive adhesive on at least one of the flexible bonding region and the display screen bonding region (e.g., an anisotropic conductive adhesive with a predetermined length can be applied at the pins of the flexible bonding region or the display screen bonding region where the bonding process is to be performed); aligning the first metal pins of the flexible bonding region with the second metal pins of the display screen bonding region to be bonded to the first metal pins (at this time, a certain pressure can also be applied to the flexible bonding region and the display screen bonding region such that the first metal pins and the second metal pins are connected preliminarily); heating the anisotropic conductive adhesive on the flexible bonding region and the display screen bonding region.

The above pre-pressing and heating operations can be carried out by using a pressure head of a bonding device, and with a high temperature and a pressure provided by the bonding device, conductive particles in the anisotropic conductive adhesive are deformed and the insulating layer is also broken, so electrical connection between the first metal pins and the second metal pins is realized. Meanwhile, the anisotropic conductive adhesive is polymerized and hardened at the high temperature such that the printed circuit board and the display screen are connected together, thereby providing sufficient mechanical connection strength.

In some embodiments, the bonding process can be performed respectively on the flexible bonding region of each sub-circuit board of the printed circuit board and the corresponding display screen bonding region of the display screen, i.e., the bonding process is performed for each sub-circuit board individually, or the bonding process is performed for the flexible bonding regions of at least two sub-circuit boards and the corresponding display screen bonding regions with the at least two sub-circuit boards taken as a whole, so that the number of bonding processes can be decreased.

With the bonding method provided in the embodiments of the application, the sub-circuit boards are connected with each other via the flexible connector, so the pitch between the flexible bonding region of any sub-circuit board and the corresponding display screen bonding region during the bonding process will not affect the bonding process for other sub-circuit boards, or have less impact on other sub-circuit boards, which can avoid pin mismatch between the first metal pins of the printed circuit board and the second metal pins of the display screen and thus improve the yield of the display products.

It should be understood that directional or positional relations indicated by terms such as "length", "width", "up", "down", "front", "back", "left", "right", "vertical", "horizontal", "top", "bottom", "inside" and "outside" are directional or positional relations shown on the basis of the drawings. They are used only for describing the embodiments of the application and simplifying the description, instead of indicating or implying that the indicated devices or components must be orientated specifically, or constructed and operated in a specific orientation, so they cannot be construed as limiting the protection scope of the application.

Besides, terms such as "first" and "second" are used only for descriptive purposes and should not be construed as indicating or implying relative importance or hinting at the number of the indicated technical features. Thereby, features defined by "first" and "second" can comprise one or more such features explicitly or implicitly. In the description of the application, unless otherwise defined specifically, "multiple" means two or more.

Unless otherwise defined, technical and scientific terms used herein have the same meaning as commonly understood by a skilled person in the art of the application. Terms used herein are only intended for describing the specific implementation, rather than limiting the protection scope of the application. Terms such as "arrange" used herein may mean either direct connection of one component to another, or connection of one component to another via an intermediate part. A feature described in one embodiment herein can be applied to another embodiment independently or in combination with other features, unless this feature is not inapplicable in said another embodiment or explained otherwise.

The technical solution of the application has been explained through the above embodiments, but it should be understood that the above embodiments are only used for exemplary and explanatory purposes, rather than intended for limiting the protection scope of the application within the scope of the described embodiments. Those skilled in the art can understand that based on the teaching of the embodiments herein many more variations and modifications can be made, and these variations and modifications all fall within the scope of the application.

The invention claimed is:

1. A display module, comprising a display screen and a printed circuit board bonded to the display screen, wherein the printed circuit board comprises:
    a plurality of sub-circuit boards; and
    a flexible connector between adjacent sub-circuit boards of the plurality of sub-circuit boards,
    wherein the flexible connector is configured to connect the adjacent sub-circuit boards of the plurality of sub-circuit boards with each other,
    wherein each of the plurality of sub-circuit boards comprises a rigid board region and a flexible bonding region, the flexible bonding region is adjacent to the rigid board region and connected therewith as a whole,
    wherein the display screen comprises a flexible display screen, and the flexible display screen comprises a display screen bonding region corresponding to the flexible bonding region of the printed circuit board, and the display screen bonding region comprises a plurality of second metal pins, the flexible bonding region of the printed circuit board comprises a plurality of first metal pins, the plurality of second metal pins are in one-to-one correspondence with and contact the plurality of first metal pins of the flexible bonding region, respectively,
    wherein at least part of the plurality of sub-circuit boards comprise a first integrated circuit chip in the rigid board region of the sub-circuit boards, and the flexible display screen comprises a second integrated circuit chip, and the first integrated circuit chip is electrically connected to the second integrated circuit chip via the first metal pins and the second metal pins, and
    wherein the flexible bonding region of the sub-circuit board is bent and the first integrated circuit chip in the rigid board region is hidden behind the display screen.

2. The display module according to claim 1, wherein the second integrated circuit chip comprises at least one selected from a group consisting of a data driving circuit and a gate driving circuit, and the first integrated circuit chip comprises at least one selected from a group consisting of a power supply circuit and a timing control circuit.

3. A display device, comprising the display module according to claim 1.

4. The printed circuit board according to claim 1, wherein each of the plurality of sub-circuit boards comprises a rigid board region and a flexible bonding region, the flexible bonding region is adjacent to the rigid board region and a thickness of the flexible bonding region is smaller than a thickness of the rigid board region.

5. The printed circuit board according to claim 4, wherein the flexible bonding region comprises a flexible bendable material, a first wire and a first metal pin, and wherein the first wire is drawn from the rigid board region and extends to the first metal pin within the flexible bendable material, the first metal pin is exposed to an outside of the flexible bendable material.

6. The printed circuit board according to claim 5, wherein the flexible connector comprises a second wire for electrically connecting the adjacent sub-circuit boards of the plurality of sub-circuit boards with each other.

* * * * *